(12) United States Patent
Kondo

(10) Patent No.: US 10,429,448 B2
(45) Date of Patent: Oct. 1, 2019

(54) METHODS AND APPARATUS FOR MEASURING A ROUTE RESISTANCE OF A BATTERY SYSTEM

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 175 days.

(21) Appl. No.: 15/355,560

(22) Filed: Nov. 18, 2016

(65) Prior Publication Data

US 2018/0143261 A1    May 24, 2018

(51) Int. Cl.
*G01R 31/389*    (2019.01)
*G01R 31/367*    (2019.01)
*G01R 31/374*    (2019.01)
*G01R 31/3835*    (2019.01)

(52) U.S. Cl.
CPC ......... *G01R 31/389* (2019.01); *G01R 31/367* (2019.01); *G01R 31/374* (2019.01); *G01R 31/3835* (2019.01)

(58) Field of Classification Search
CPC ................ G01R 31/3662; G01R 31/3651
USPC ............................................... 702/63
See application file for complete search history.

(56) References Cited

U.S. PATENT DOCUMENTS

| 2004/0073264 | A1  |  4/2004 | Lyden |
| 2004/0246008 | A1  | 12/2004 | Barr |
| 2013/0325303 | A1* | 12/2013 | Kiuchi ............... G01R 31/025 701/112 |
| 2015/0198674 | A1  |  7/2015 | Kroker |
| 2015/0303434 | A1* | 10/2015 | Holtappels ......... H01M 2/1072 320/136 |

FOREIGN PATENT DOCUMENTS

JP    2009063460    3/2009

\* cited by examiner

*Primary Examiner* — Ricky Ngon
(74) *Attorney, Agent, or Firm* — The Noblitt Group, PLLC; Hettie L. Hines

(57) ABSTRACT

Various embodiments of the present technology may comprise methods and apparatus to measure a route resistance of a battery. The method and apparatus may comprise utilizing various parameters, such as known resistance characteristics, voltage, and current to calculate the route resistance of the battery. In various embodiments, the route resistance may be used to provide a more accurate estimate of the relative state of charge (RSOC).

13 Claims, 6 Drawing Sheets ise a cellular phone, a computer, a tablet, or a camera.
METHODS AND APPARATUS FOR MEASURING A ROUTE RESISTANCE OF A BATTERY SYSTEM

BACKGROUND OF THE TECHNOLOGY

"Battery capacity" is a measure (typically in ampere hours) of the charge stored by the battery, and is determined by the mass of active material contained in the battery. The full charge capacity represents the maximum amount of energy that can be extracted from the battery under certain specified conditions. Even when the battery is new, however, the actual full charge capacity of the battery can vary from the rated (ideal) full charge capacity.

The remaining battery capacity may be expressed as a percentage of the ideal full charge capacity of the battery. This percentage value is referred to as the relative state of charge (RSOC) of the battery. Methods for measuring the remaining battery capacity may utilize the output voltage of the battery. The output voltage of the battery, however, is influenced by a variety of factors.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates a block diagram of a battery system in accordance with an exemplary embodiment of the present technology;

FIG. 2 representatively illustrates a block diagram of fuel gauge circuit in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various temperature sensors, processing units, computations, algorithms, and the like, which may carry out a variety of functions. In addition, the present technology may be practiced in conjunction with any number of systems, such as automotive systems, emergency charging systems, and systems employed in consumer electronics and consumer wearables, and the systems described are merely exemplary applications for the technology. Further, the present technology may employ any number of conventional techniques for measuring voltage, measuring current, measuring temperature, and the like.

Figure 1:
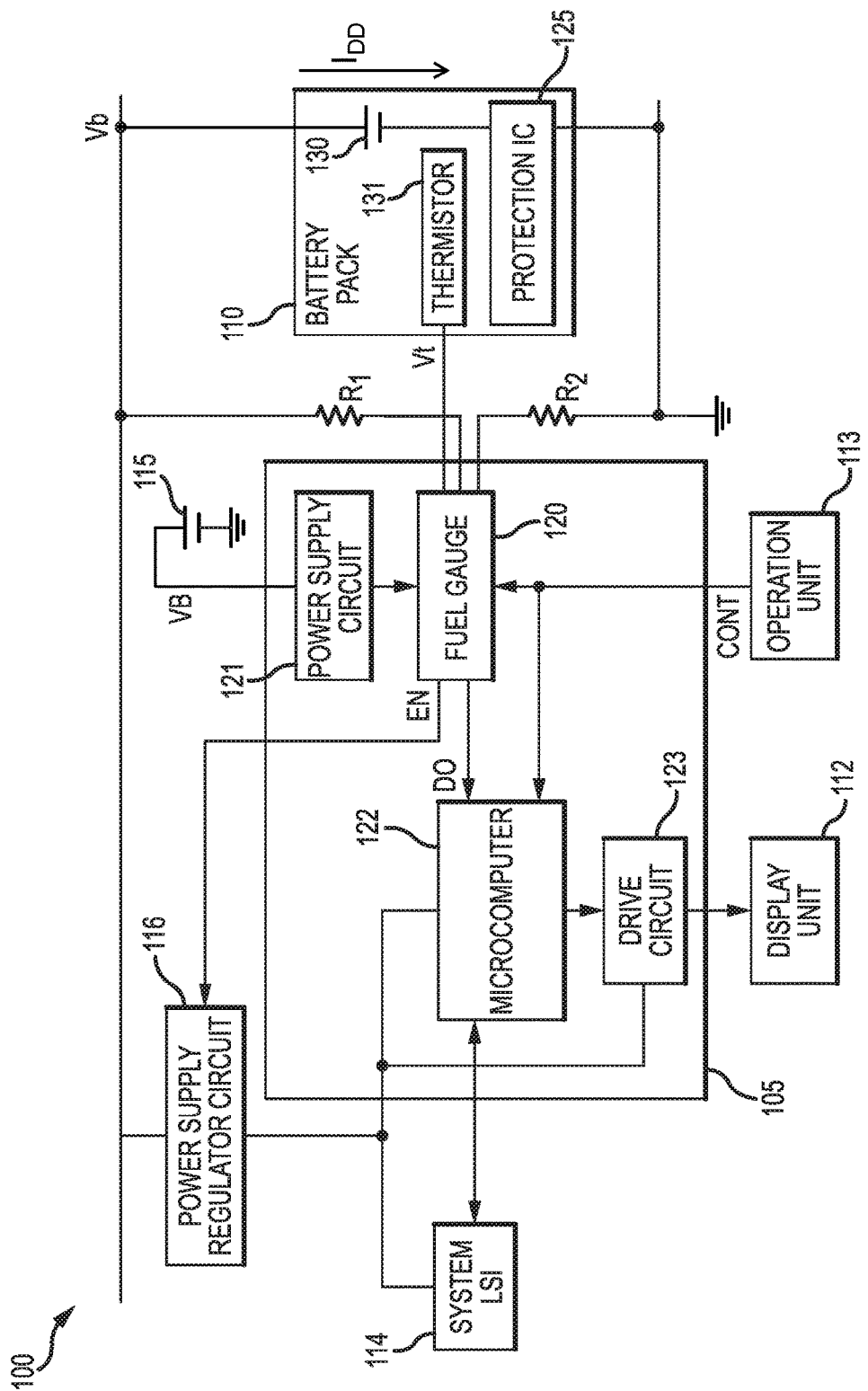

Methods and apparatus for measuring a route resistance of a battery according to various aspects of the present technology may operate in conjunction with any suitable battery-operated apparatus. For example, the apparatus may comprise a cellular phone, a computer, a tablet, or a camera. Referring to FIG. 1, in an exemplary embodiment of the present technology, methods and apparatus for measuring the route resistance of a battery may operate in conjunction with a system 100, such as a cellular phone or other communication system, including a battery analysis circuit 105 and a battery pack 110. The system may include further elements, such as a display unit 112, a power supply regulator circuit 116, a system LSI (Large Scale Integration) circuit 114, and an operation unit 113. According to various embodiments, the system may also comprise other elements, such as a secondary battery 115 to operate a real-time clock circuit (not shown) and/or to update time of the cellular phone when the cellular phone is turned off.

The battery pack 110 may be a power supply for the cellular phone, and may comprise a battery 130, such as a chargeable lithium ion battery. In an exemplary embodiment, the battery 130 generates an output voltage $V_b$ between a negative electrode and a positive electrode of the battery 130.

The battery pack 110 may further comprise a temperature sensor that provides a signal according to the temperature of the battery 130. In the present embodiment, the temperature sensor comprises a thermistor 131 that generates a voltage $V_t$ which corresponds to a temperature of the battery 130. The temperature sensor may, however, comprise any appropriate sensor or other device or system for generating a signal corresponding to the temperature of the battery 130. The battery pack 110 may further comprise a protection integrated circuit 125 to protect the battery 130 from overcharge, overdischarge, and overcurrent. The battery pack 110 may further comprise any other appropriate components, such as connection points, wires, circuit elements, integrated circuits, and the like.

In an exemplary embodiment, a voltage generated between a negative-side electrode and a positive-side electrode of the battery 130 is referred to as an output voltage $V_b$ of the battery 130. The battery 130 exhibits an internal resistance. The route resistance may comprise the additional resistance in the power supply system associated with the battery 130, such as in the wires that connect the battery 130 to other elements in the system and in other components associated with the power supply system.

The display unit 112 displays information regarding the system 100. The display unit 112 may comprise any appropriate display for the particular application and/or environment, for example a conventional display, such as a liquid crystal panel, provided in a cellular phone to display characters, images, and the like.

The operation unit 113 provides an interface for the user to control the device, and may comprise any suitable control interface for the particular device or application. For example, the operation unit 113 may comprise one or more buttons of various types, such as a dial key, a power key, and the like (not shown), to operate the cellular phone, and may output control signals CONT according the operation of the keypad. If a user manipulates the powerkey in the operation unit 113 to start the cellular phone, for example, the control signal CONT to start the cellular phone is outputted from the operation unit 113. The operation unit 113 may comprise any appropriate interface for facilitating user control, such as a conventional keypad, a touchscreen, a voice cognition system, and/or gaze-operated input system.

The system LSI circuit 114 performs the communication functions of the device. The system LSI circuit 114 may comprise any suitable system for the particular device or application, such as cell phone communication circuits, programmable logic devices, memory devices, and the like. In the present embodiment, the LSI circuit 114 comprises a large scale integration circuit to realize various functions, for example communication in the cellular phone.

In various embodiments, the system 100 may further comprise a power supply regulator circuit 116 to generate one or more power supply voltages for powering the various elements of the device. For example, the power supply regulator circuit 116 may capable of operating the LSI circuit 114 and other system elements based on the output voltage $V_b$ of the battery 130 and/or power from an external power source. The power supply regulator circuit 116 may comprise a conventional power supply regulation system for providing appropriate voltages for the various elements.

The fuel gauge circuit 120 receives various inputs, computes a route resistance between the battery 130 and the fuel gauge circuit 120, and stores the route resistance for later use. The fuel gauge circuit 120 may receive signals corresponding to the relevant criteria, such as a temperature signal from the temperature sensor 131, battery capacity data, and a voltage signal from the battery 130, as well as control signals, such as from the operation unit 113 and/or the microcomputer 122. The fuel gauge 120 may operate as a voltage sensor by detecting the output voltage $V_b$. The fuel gauge circuit 120 may also generate signals, such as signals corresponding to the capacity of the battery 130.

Figure 2:
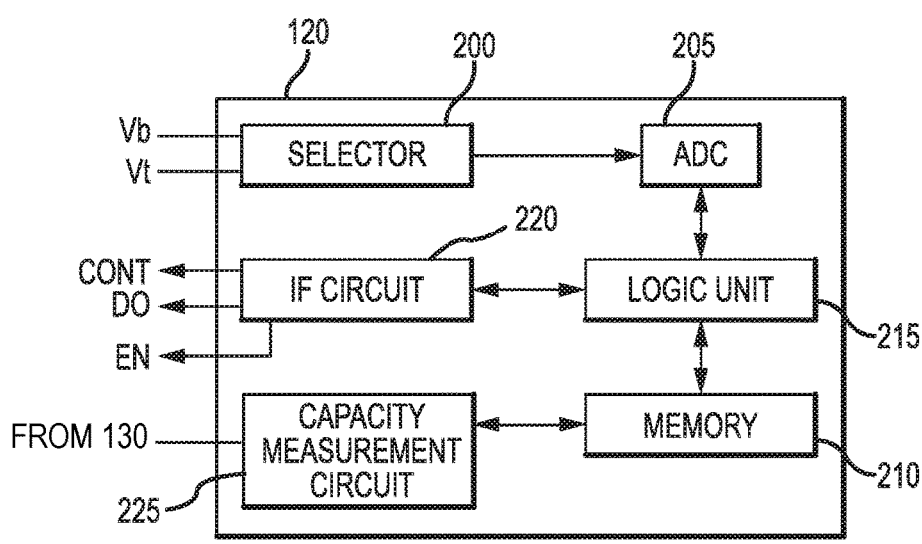

The fuel gauge circuit 120 may be implemented in any suitable manner, such as in the form of a large scale integrated (LSI) circuit. For example, referring to FIG. 2, one embodiment of the fuel gauge circuit 120 may comprise a logic unit 215 and a memory 210. The fuel gauge circuit 120 may further comprise a selector 200, an AD converter 205, and an interface (IF) circuit 220. In one embodiment, the selector 200 may comprise a circuit to select the output voltage $V_b$ or voltage $V_t$, to be provided to the AD converter 205 based on an instruction from the logic unit 210.

The AD converter 205 may comprise a circuit to convert signals, such as the output voltage $V_b$ and thermistor voltage $V_t$ output from the selector 200, into digital voltage values. The AD converter 205 may comprise any appropriate analog-to-digital architecture, and may be selected based on a particular application. The IF circuit 220 may comprise a circuit to exchange various data between the logic unit 215 and other systems, such as the operation unit 113, the power supply regulator circuit 116, and the microcomputer 122. The IF circuit 220 may also facilitate control of the constant current circuit 250, for example via a signal $EN_{CC}$.

The fuel gauge circuit 120 may further comprise a capacity measurement circuit 225 to measure a charge capacity and a discharge capacity of the battery 130, for example by measuring and/or otherwise tracking the amount of charge (for example, measured in milli-ampere-hours) added to or subtracted (i.e., removed) from the battery during the charging and discharging states over a period time. The capacity measurement circuit 225 may comprise any suitable circuit for measuring and/or tracking the amount of charge added to and/or subtracted from the battery at any given time or otherwise determining the charge capacity and/or discharge capacity of the battery 130. In the present embodiment, the capacity measurement circuit 225 is responsive to the battery 130 such that it may be directly or indirectly connected to the battery 130.

The capacity measurement circuit 225 may utilize various sensing techniques to detect and/or measure the battery current $I_{DD}$. For example, in various embodiments, the capacity measurement circuit 225 may comprise a conventional coulomb counter configured to detect charge and discharge operations of the battery according to the battery current and measure the charge as a result of the charging and discharging operations. In other embodiments, the capacity measurement circuit 225 may monitor the charge and discharge operations and measure the charge added and subtracted according to the methods disclosed in U.S. Pat. No. 8,664,919, issued Mar. 4, 2014, to Yamada, et al.

The capacity measurement circuit 225 may operate in conjunction with the memory 210 to track the added and subtracted charge of the battery 130 as the battery charges and discharges. For example, the capacity measurement circuit 225 may be coupled one or more count registers to measure the added charge as the battery charges, and to measure the subtracted charge as the battery discharges. For example, one count register may measure and track the amount of charge added to the battery 130, wherein the value stored in the count register may be referred to as a charge capacity Q3. A different count register may measure and track the amount of charge subtracted from the battery 130, wherein the value stored in the count register may be referred to as a discharge capacity Q4.

The logic unit 215 may control the fuel gauge circuit 120, and realize various functions by executing various programs stored in the memory 210. In various embodiments, the logic unit 215 may perform various calculations, such as computing a route resistance $R_{route}$, perform decision-making functions, and/or transmit various control functions. The logic unit 215 may also receive information regarding the measured data, as well as reference data stored in the memory 210. The logic unit 215 may comprise any suitable hardware and/or software to carry out the relevant functions.

The logic unit 215 may responsive to the capacity measurement circuit 225, for example via direct or indirect communication between them. The logic unit 215 may also have access to the memory 210. In various embodiments, the logic unit 215 may determine a remaining capacity of the battery according to the rated full charge capacity and an ideal reference-to-full capacity based on the rated full charge capacity and the remaining capacity. The logic unit 215 may also determine an actual reference-to-full capacity based on the charge capacity and the discharge capacity, and the route resistance based on the ideal reference-to-full capacity, the actual reference-to-full capacity, and baseline characteristic data of the battery In an exemplary embodiment, the logic unit 215 may utilize information, such as the output voltage $V_b$, to determine a relative state of charge (RSOC) of the battery 130 using conventional techniques. The RSOC is generally expressed as a percentage and reflects the remaining capacity of the battery.

The logic unit 215 may compute a quantitative value for an ideal reference-to-full capacity Q1 according to the measured RSOC and an ideal full charge capacity. The ideal reference-to-full capacity Q1 represents the ideal (theoretical) amount of charge needed to fully charge the battery 130.

The quantitative value for the ideal reference-to-full capacity Q1 may be realized by multiplying the ideal full charge capacity by the RSOC to obtain a quantitative value for the remaining capacity, and then subtracting the remaining capacity from the ideal full charge capacity. For example, if the ideal full charge capacity is 1000 mAh and the measured RSOC is 40%, then the remaining capacity is 400 mAh, and the ideal reference-to-full capacity Q1 equals 600 mAh.

The logic unit 215 may compute an actual reference-to-full capacity Q2. The actual reference-to-full capacity Q2 represents the actual amount of charge needed to fully charge the battery 130. The logic unit 215 may obtain the charge capacity Q3 and the discharge capacity Q4 from the memory and compute the actual reference-to-full capacity Q2 by subtracting the discharge capacity Q4 from the charge capacity Q3 (i.e., Q2=Q3−Q4).

The logic unit 215 may compute a change between an actual reference-to-full capacity Q2 and the ideal reference-to-full capacity Q1:

$$\Delta Q = Q2 - Q1 \qquad \text{(equation 1)}.$$

In general, charge Q can be expressed as:

$$Q = I \times \text{time},$$

where I is the current (e.g., $I_{DD}$) measured in amperes, time is measured in seconds, and Q is the charge measured in A*s (ampere seconds) or mAh (milliampere hours).

Therefore the ideal reference-to-full capacity Q1 can be expressed as:

$$Q1 = I \times \text{time} \qquad \text{(equation 2)},$$

where I=V1/R, and actual reference-to-full capacity Q2 is expressed as:

$$Q2 = I' \times \text{time} \qquad \text{(equation 3)},$$

where I'=V2/R and where R is the total resistance. Therefore, equation 1 can be rewritten as:

$$\Delta Q = \left( \frac{V2}{R} - \frac{V1}{R} \right) \times \text{time}. \qquad \text{(equation 4)}$$

In an actual case, however, the total resistance R is a combination of the internal resistance $R_{int}$ of the battery 130 and the route resistance $R_{route}$. Therefore, Equation 4 may be adjusted to account for the route resistance $R_{route}$.

The following expressions represent the voltage in an ideal case, where the only resistance considered is the internal resistance $R_{int}$ (R=$R_{int}$), and in the actual case, where both the internal resistance $R_{int}$ and the route resistance $R_{route}$ are considered (R=$R_{int}$+$R_{route}$):

$$V1 = I \times R_{int} \qquad \text{(equation 5, ideal case)},$$

where V1 is the ideal voltage, I is the current (e.g., $I_{DD}$) and $R_{int}$ is the internal resistance; and $$V2 = I \times (R_{int} + R_{route}) \qquad \text{(equation 6, actual case)},$$

where V2 is the actual voltage, I is the current (e.g., $I_{DD}$), $R_{int}$ is the internal resistance and $R_{route}$ is the route resistance. Therefore, equation 4 may be rewritten to account for the route resistance Rroute by substituting V1 and V2 from equations 5 and 6, respectively, into equation 4:

$$\Delta Q = [(R_{int} + R_{route}) \times I - R_{int} \times I] \times \frac{\text{time}}{R_{int}}. \qquad \text{(equation 7)}$$

By reducing equation 7 and solving for the route resistance $R_{route}$, the route resistance $R_{route}$ may be expressed as:

$$R_{route} = \frac{\Delta Q \times R_{int}}{Q1}. \qquad \text{(equation 8)}$$

The logic unit 215 may utilize the values for the internal resistance $R_{int}$, ideal reference-to-full capacity Q1, and the change in capacity $\Delta Q$ to compute the route resistance $R_{route}$ according to equation 8. The logic unit 215 may then transmit the route resistance $R_{route}$ data to the memory 210, where the memory 210 may store the data for later use. For example, the logic unit 215 may utilize the route resistance $R_{route}$ data to re-compute the RSOC.

Figure 3:
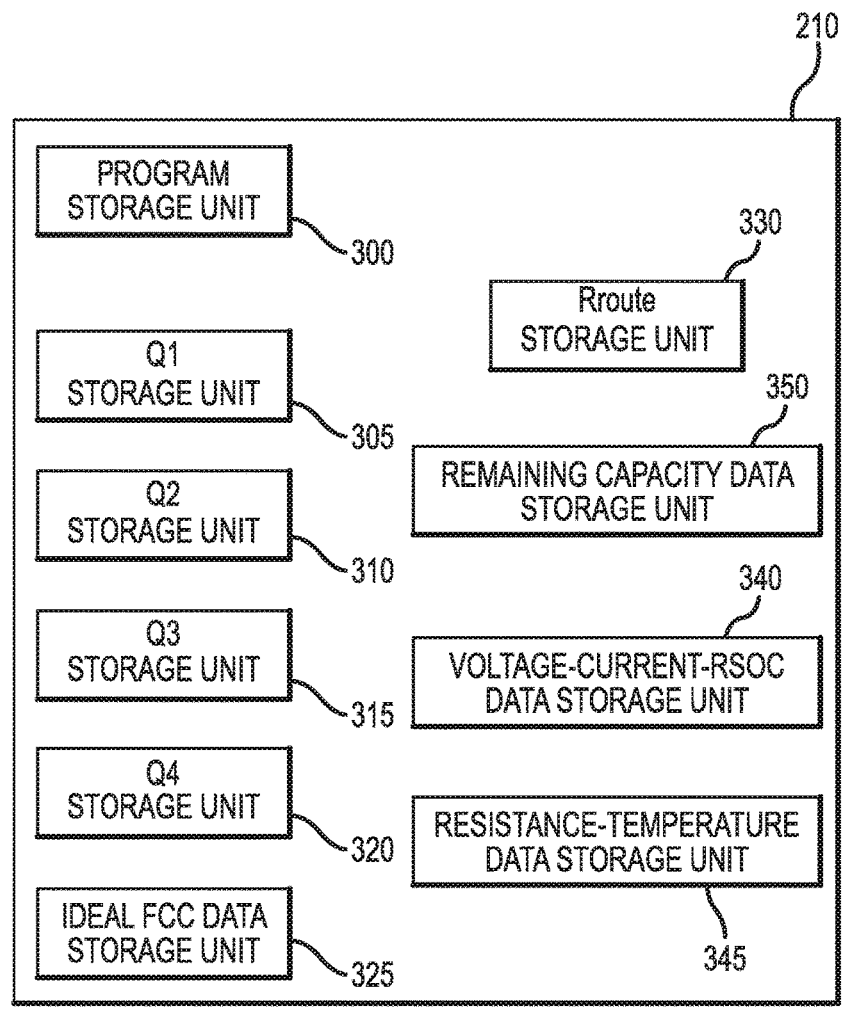
FIG. 3 is a block diagram of a memory unit in accordance with an exemplary embodiment of the present technology.

Referring to FIG. 3, in various embodiments, the memory 210 may comprise a circuit to store programs executed by the logic unit 215 and various types of data. In an exemplary embodiment, the memory 210 may comprise ROM (read only memory) and RAM (random access memory). The storage area of the memory 210 may comprise a program storage unit 300 to store various programs to operate the logic unit 215.

In an exemplary embodiment, the memory 210 may comprise various registers to store battery data. For example, the memory 210 may comprise a first register 305 to store a first capacity value (e.g., the ideal reference-to-full capacity Q1), a second register 310 to store a second capacity value (e.g., the actual full charge capacity Q2), a third register 315 to store a third capacity value (e.g., the charge capacity Q3), and a fourth register 320 to store a fourth capacity value (e.g., the discharge capacity Q4). Various registers may be configured as conventional count registers to increment and/or decrement their contents and store data simultaneously. For example, the third register 315 may be configured as a count register to track the amount (for example, measured in milliampere hours) of charge added to the battery during a charging state, while the fourth register 320 may also be configured as a count register to track the amount of charge removed from the battery during a discharging state.

The memory 210 may further comprise baseline characteristics of the battery 130, such as the ideal (i.e., rated) full charge capacity (FCC) and the baseline internal resistance characteristics of the battery 130. For example, the memory 210 may comprise an FCC data storage unit 325 that contains data relating to the ideal FCC value of the new battery 130. The memory 210 may further comprise a remaining capacity data storage unit 350 to store the RSOC.

Figure 4:
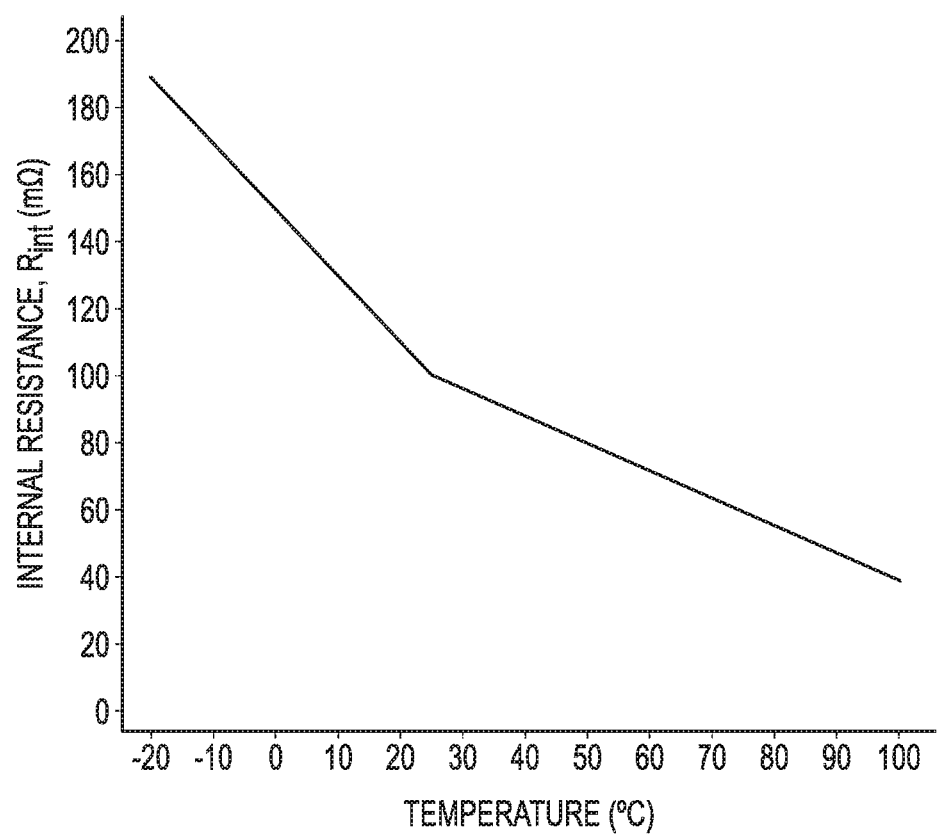
FIG. 4 is a graph indicating a relationship between internal resistance and temperature of a battery in accordance with an exemplary embodiment of the present technology.

In an exemplary embodiment, the memory 210 may comprise a route resistance storage unit 330 and an internal resistance data storage unit 345. The route resistance storage unit 330 may store the computed route resistance $R_{route}$, and the internal resistance data storage unit 345 may store data indicating a relationship between a baseline internal resistance $R_{int}$ (such as in m-ohms) and the temperature T (such as in degree Celsius) of the battery 130. The baseline internal resistance $R_{int}$ versus temperature data may relate to new battery data. For example, and referring to FIG. 4, the internal resistance $R_{int}$ and temperature data may be converted to a look-up table. In general, as the temperature T decreases, the internal resistance $R_{int}$ increases.

Figure 5:
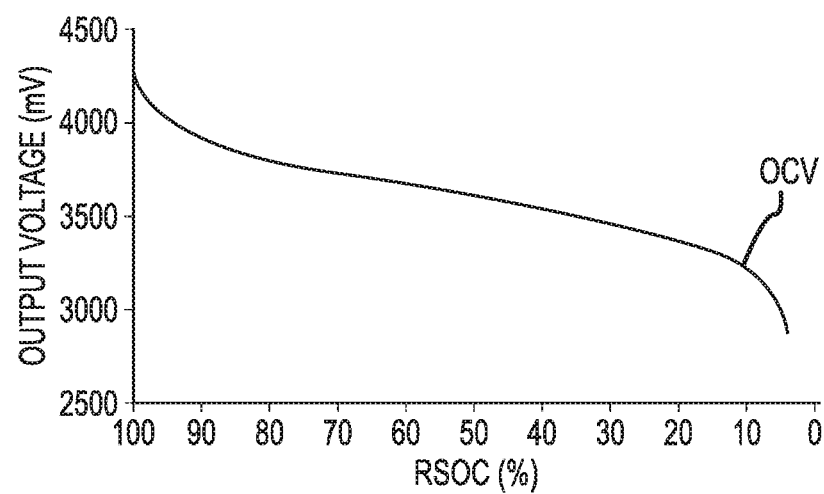
FIG. 5 is a graph indicating a relationship between voltage, and remaining capacity of a battery in accordance with an exemplary embodiment of the present technology.
Figure 6:
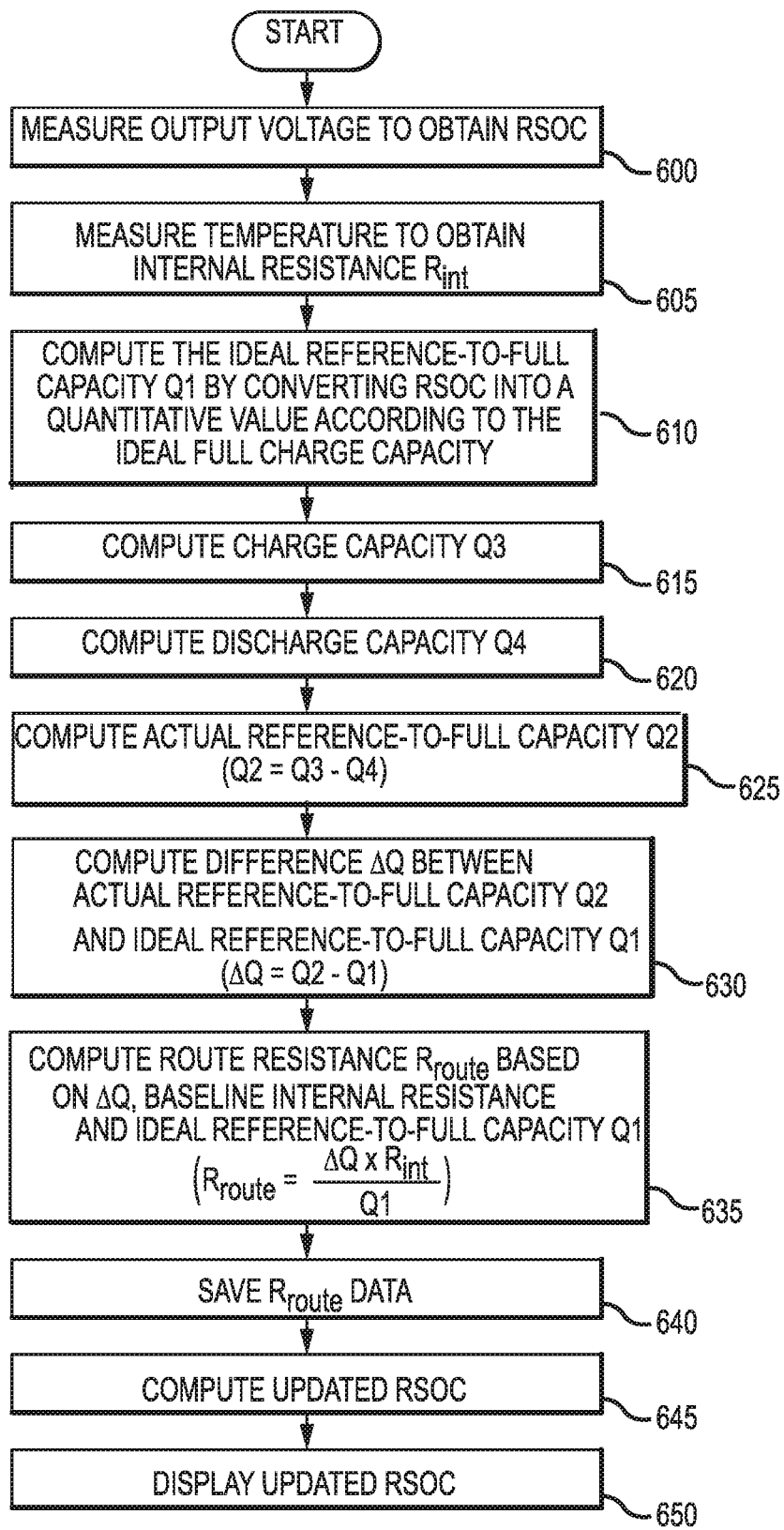
FIG. 6 is a flow chart for measuring the route resistance of a battery in accordance with an exemplary embodiment of the present technology.

In an exemplary embodiment, referring to FIG. 5, the memory 210 may comprise a voltage-RSOC data storage unit 340 to store data that describes the relationship between the output voltage $V_b$ and the RSOC. The data may be stored and/or computed in any suitable manner, such as in a look-up table. The voltage-RSOC data storage unit 340 may store open circuit voltage (OCV) characteristics at a specified temperature, for example 20 degrees Celsius. When graphed, the OCV characteristics may be referred to as an OCV curve. The OCV curve (characteristics) may be used to determine the RSOC of the battery 130. For example, given a particular output voltage $V_b$, the RSOC of the battery 130 may be determined according to the point on OCV curve corresponding to the particular output voltage $V_b$.

Multiple variables may be utilized to measure the battery capacity as the battery ages, such as temperature, the internal resistance of the battery 130, the route resistance between the battery and the fuel gauge circuit 120, current, voltage, and the RSOC of the battery. The route resistance may be measured prior to installing the battery pack 110 and the fuel gauge circuit 120, but the route resistance differs among devices, requiring individually measuring and storing the route resistance value, such as in the memory 210. Further, if the battery pack is replaced, the route resistance changes because the resistance due to the protection IC 125 is different.

In the present embodiment, the route resistance $R_{route}$ may comprise the resistance in the wires that connect the battery to the fuel gauge circuit 120 and the resistance of the protection IC 125. As such, considering the route resistance $R_{route}$ may provide a more accurate measurement of the battery capacity.

Referring to FIGS. 1 through 6, in operation, the fuel gauge circuit 120 may perform various calculations and various measurements to compute the route resistance $R_{route}$ of the battery 130 to the fuel gauge circuit 120. In various embodiments, the fuel gauge circuit 120 may measure the amount of charge and discharge of the battery 130, compute the actual reference-to-full capacity Q2 of the battery 130, and compute the route resistance $R_{route}$ based on the internal resistance $R_{int}$ of the battery 130, the actual reference-to-full capacity Q2, and the ideal reference-to-full capacity Q1.

In an exemplary embodiment, the fuel gauge circuit 120 may first obtain an RSOC value. The RSOC value may be calculated utilizing any appropriate method, such as by measuring the output voltage $V_b$ and utilizing data describing the relationship between voltage and RSOC stored in the voltage-RSOC data storage unit 340 (600). The RSOC value may be stored in the memory 210.

The fuel gauge circuit 120 may retrieve the temperature of the battery 130 to obtain the internal resistance $R_{int}$ (605). For example, the fuel gauge circuit 120 may obtain temperature data from the temperature sensor, for example via the thermistor 131. The fuel gauge circuit 120 may then utilize the temperature data and the data from the resistance-temperature data storage unit 345 to determine the internal resistance $R_{int}$ of the battery 130.

The fuel gauge circuit 120 may utilize battery characteristics stored in the memory 210 to compute the ideal reference-to-full capacity Q1 (610). For example, the fuel gauge circuit 120 may extract the ideal FCC data and the RSOC from the memory 120. The fuel gauge circuit 120 may then compute the ideal reference-to-full capacity Q1, such as according to the description above, to determine the theoretical amount of charge required to bring the battery 130 to full charge.

The fuel gauge circuit 120 may further compute the actual reference-to-full capacity Q2, which may be based on measurements of the battery capacity while battery 130 is installed in the system 100 and undergoing charging and discharging. The actual reference-to-full capacity Q2 may be measured or otherwise established in any suitable manner (625). For example, in the present embodiment, the fuel gauge circuit 120 measures the charge capacity Q3 (615) and the discharge capacity Q4 of the battery 130 (620). For example, the fuel gauge circuit 120 may measure the charge capacity Q3 and the discharge capacity Q4 according to the methods described above. The fuel gauge circuit 120 may store the measured values in the memory 210.

The fuel gauge circuit 120 may then compute a difference capacity ΔQ between the actual reference-to-full capacity Q2 and the ideal reference-to-full capacity Q1 (i.e., ΔQ=Q2−Q1) (630).

The fuel gauge circuit 120 may then compute the route resistance $R_{route}$ based on the difference capacity ΔQ, the baseline internal resistance $R_{int}$ characteristics, and the ideal capacity Q1, according to equation 8, described above. The fuel gauge circuit 120 may store the route resistance $R_{route}$ value in the memory 210 (640). According to various embodiments, the route resistance $R_{route}$ value may be measured only one time, such as just after the battery pack 110 is installed in the system 100.

In various embodiments, the fuel gauge circuit 120 may utilize the route resistance $R_{route}$ data to compute a total resistance $R_{total}$ for the battery system 100, wherein the total resistance $R_{total}$ may comprise the internal resistance $R_{int}$ of the battery and the route resistance $R_{route}$. The fuel gauge circuit 120 may utilize the total resistance $R_{total}$ to compute an updated, more accurate RSOC (645). The updated RSOC may be displayed to user, for example on the display unit 112.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system 100 may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A circuit for calculating a route resistance of a battery system having a battery, comprising:
   a capacity measurement circuit responsive to the battery and configured to measure charge added to the battery and charge removed from of the battery;
   a memory unit, wherein the memory unit stores:
      baseline characteristic data of the battery; and
      a rated full charge capacity of the battery;
   a logic circuit responsive to the capacity measurement circuit and having access to the memory, wherein the logic circuit calculates:
      a remaining capacity of the battery according to the rated full charge capacity; an ideal reference-to-full capacity based on the rated full charge capacity and the remaining capacity;
      an actual reference-to-full capacity based on the charge added to the battery and the charge subtracted from the battery; and
      the route resistance based on the ideal reference-to-full capacity, the actual reference-to-full capacity, and the baseline characteristic data of the battery.

2. The circuit according to claim 1, wherein the capacity measurement circuit comprises:
   a charge capacity circuit configured to measure the charge added to the battery; and
   a discharge capacity circuit configured to measure the charge removed from the battery.

3. The circuit according to claim 1, wherein the baseline characteristics comprise:
   internal resistance data according to temperature; and
   open circuit voltage data.

4. The circuit according to claim 1, further comprising a temperature sensor responsive to a temperature of the battery, and wherein the logic circuit is responsive to the temperature sensor and determines an internal resistance of the battery based on the temperature.

5. The circuit according to claim 1, wherein the logic circuit further calculates a relative state of charge of the battery based on the route resistance of the battery.

6. The circuit according to claim 1, wherein the logic circuit computes a relative state of charge of the battery utilizing an output voltage of the battery and open circuit voltage data of the battery.

7. The circuit according to claim 1, wherein the logic circuit further computes the remaining capacity based on an output voltage of the battery.

8. The circuit according to claim 1, wherein the capacity measurement circuit comprises a first count register to measure the charge added to the battery, and a second count register to measure the charge removed from the battery.

9. A system for calculating a route resistance of a battery system having a battery, comprising:
   a capacity measurement circuit responsive to the battery, comprising:
      a charge capacity circuit comprising a first count register and configured to measure a charge capacity for the battery; and
      a discharge capacity circuit comprising a second count register and configured to measure a discharge capacity for the battery;
   a voltage sensor responsive to an output voltage of the battery;
   a memory unit, wherein the memory unit stores:
      baseline characteristic data of the battery;
      a rated full charge capacity of the battery;
      a remaining capacity;
      the charge capacity; and
      the discharge capacity; and
   a logic circuit having access to the memory and responsive to the voltage sensor,
      wherein the logic unit calculates:
         the remaining capacity of the battery according to the output voltage and the baseline characteristics;
         an ideal reference-to-full capacity based on the rated full charge capacity and the remaining capacity;
         an actual reference-to-full capacity based on the charge capacity and the discharge capacity; and
         a route resistance based on the ideal reference-to-full capacity, the actual reference-to-full capacity, and the baseline characteristic data of the battery.

10. The system according to claim 9, wherein the baseline characteristics comprises:
    internal resistance data according to temperature; and
    open circuit voltage data.

11. The system according to claim 9, further comprising a temperature sensor responsive to the temperature of the battery, and wherein the logic circuit is responsive to the temperature sensor and determines an internal resistance of the battery based on the temperature.

12. The system according to claim 9, wherein the logic circuit further calculates a relative state of charge of the battery based on the route resistance of the battery and open circuit voltage characteristics of the battery.

13. The system according to claim 9, wherein the logic circuit further calculates a total resistance of the battery system, wherein the total resistance is equal to the internal resistance of the battery plus the route resistance.

* * * * *